United States Patent [19]

Nigorikawa

[11] Patent Number: 4,628,412
[45] Date of Patent: Dec. 9, 1986

[54] CASE FOR SHIELDING ELECTRONIC DEVICES

[75] Inventor: Shigeru Nigorikawa, Kakuda, Japan

[73] Assignee: Alps Electric Co., Ltd., Japan

[21] Appl. No.: 680,934

[22] Filed: Dec. 12, 1984

[30] Foreign Application Priority Data

Dec. 12, 1983 [JP] Japan ............................ 58-191330[U]

[51] Int. Cl.$^4$ .............................................. H05K 9/00
[52] U.S. Cl. .................................. 361/424; 174/35 R
[58] Field of Search ...................... 174/35 R; 361/424;
330/68, 67; 334/85

[56] References Cited

U.S. PATENT DOCUMENTS 3,365,621  1/1968  Von Fange et al. ............. 334/85 X
4,337,444  1/1982  Tuma et al. ........................ 332/31 T
4,370,515  1/1983  Donaldson ...................... 361/424 X
4,404,617  9/1983  Ohyama et al. .............. 174/35 R X

FOREIGN PATENT DOCUMENTS 1286165  1/1969  Fed. Rep. of Germany .... 174/35 R

Primary Examiner—A. D. Pellinen
Assistant Examiner—Morris Ginsburg
Attorney, Agent, or Firm—Guy W. Shoup

[57] ABSTRACT

A case for an electronic device includes a frame of metal having an opening, a cover of metal covering the opening, and a circuit board fixedly mounted in the frame and having a hole defined therein. The frame has a portion bent as a shield plate extending through the hole toward an inner surface of the cover. The end portion of the shield plate has a distal end bent as a contact leg held against the inner surface of the cover. The contact leg has a recess, and the circuit board includes a projecting tongue extending into the hole in alignment with the recess and supporting a ground pattern soldered to the shield plate.

5 Claims, 6 Drawing Figures

CASE FOR SHIELDING ELECTRONIC DEVICES

BACKGROUND OF THE INVENTION

The present invention relates to an electronic device such as an RF modulator, and more particularly to a case for housing and shielding a circuit of the electronic device.

FIGS. 1 and 2 of the accompanying drawings illustrate a conventional case for electronic devices. FIG. 1 shows the case in perspective with a cover removed and a bottom facing up, and FIG. 2 shows the case with the cover attached in a side elevation.

The illustrated case is used for an RF modulator having an antenna booster mixer or an RF modulator having an antenna booster switch.

Designated by the reference character 1 is a metal frame forming side plates of the case. A circuit board 2 is secured to the metal frame 1 near the bottom thereof (upper edge, as shown). The circuit board 2 supports an antenna circuit on a lefthand half portion thereof (indicated by A) and a circuit constituting an RF modulator on a righthand half portion thereof (indicated by B). To shield the circuits from each other, the interior of the frame 1 is partitioned by a shield plate 3 which is formed by bending a portion of the frame 1. The shield plate 3 has two divided end portions extending respectively through holes 2a defined in the circuit board 2 into a bottom opening (an upper opening as shown) in the frame 1. The two end portions of the shield plate 3 have distal ends bent at a right angle to provide contact legs 3a. A metal cover 4 is mounted in the upper opening in the frame 1 and has an inner surface in contact with the contact legs 3a to keep the shield plate 3 and the cover 4 at the same potential (see FIG. 2). A ground pattern of the antenna circuit (on side A) on the circuit board 2 is connected by solder bodies 5a to the shield plate 3, and a ground pattern of the RF modulator (on side B) is connected by solder bodies 5b to the shield plate 3. As illustrated in FIG. 2, another cover 6 is mounted in a lower (FIG. 1) opening of the frame 1. Two input and output connectors 7 are mounted on a lower side of the frame for connection to an antenna, and an output connector 8 is mounted on a lateral side of the frame 1 for connection to a tuner.

The above conventional case for electronic devices has had the following problems:

(1) The holes 2a defined in the circuit board 2 have to have a certain size so as to allow the contact legs 3a to pass therethrough. Since there are gaps formed between edges defining the holes 2a and the shield plate 3, the solder bodies 5a are required to be formed as bridges as shown in FIG. 2, a soldering process which is quite difficult to accomplish.

(2) To facilitate the soldering operation for forming the solder bodies 5a as bridges, it is necessary to form the ground pattern on the circuit board 2 close to the edges of the holes 2a. Therefore, difficulty has been encountered in forming the pattern on the circuit board 2.

(3) When applying the solder bodies 5b to the RF modulator circuit, the solder tends to flow onto the contact legs 3a. The solder on the contact legs 3a makes the upper surface thereof irregular rather than smooth, imparing contact between the contact legs 3a and the inner surface of the cover 4. Accordingly, the shield capability is reduced, which renders the antenna terminal voltage unstable and produces cover noise.

SUMMARY OF THE INVENTION

With the above conventional problems in view, it is an object of the present invention to provide a case for electronic devices which is adapted for reliably soldering a shield plate and a circuit board together and providing a reliable contact between the shield plate and the cover.

According to the present invention, there is provided a case for an electronic device, comprising a frame of metal having an opening, a cover of metal covering the opening, and a circuit board fixedly mounted in the frame and having a hole defined therein, the frame having a portion bent as a shield plate and having an end portion thereof extending through the hole toward an inner surface of the cover, the end portion of the shield plate having a distal end bent as a contact leg held against the inner surface of the cover, the contact leg having a recess, the circuit board including a projecting tongue extending into the hole in alignment with the recess and supporting a ground pattern soldered to the shield plate.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

An electronic device according to an embodiment of the present invention will be described with reference to FIG. 3 and those following.

Figure 1:
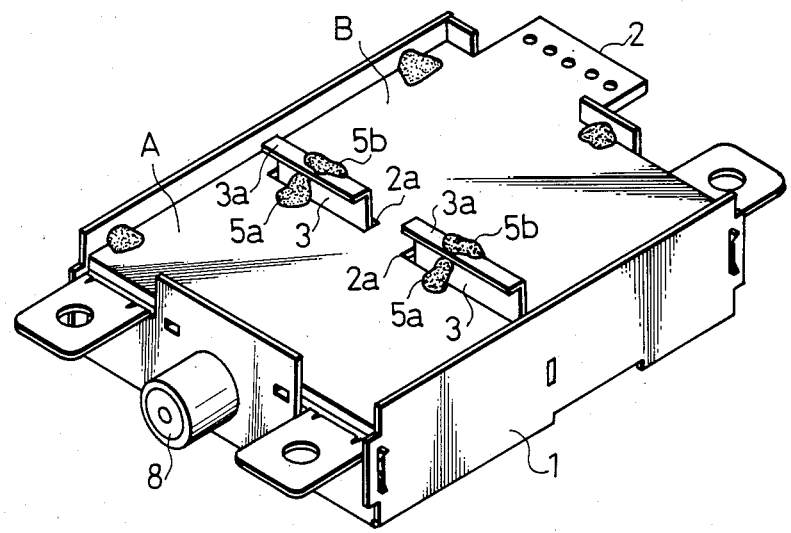
FIG. 1 is a perspective view of a conventional case for an electronic device, with a bottom of the case facing up.
Figure 2:
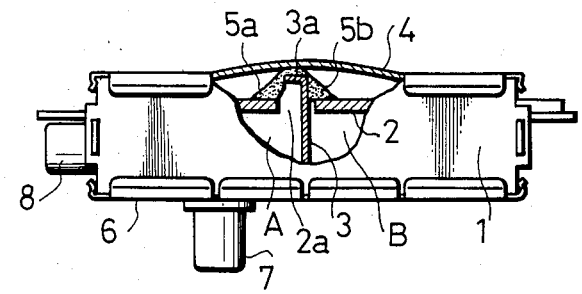
FIG. 2 is a side elevational view, partly broken away, of the case of FIG. 1 with a cover mounted.
Figure 3:
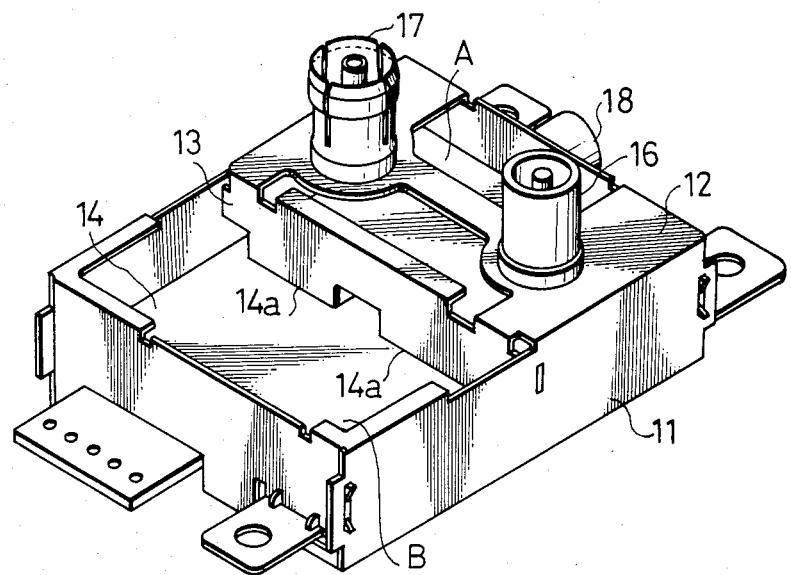
FIG. 3 is a perspective view of a case for an electronic device according to the present invention, with a top facing up.
Figure 4:
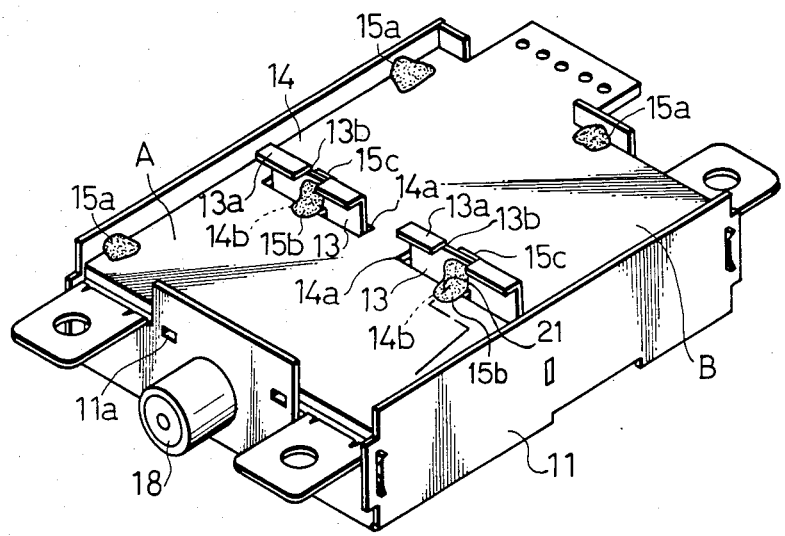
FIG. 4 is a perspective view of the case shown in FIG. 3, with a bottom facing up.
Figure 5:
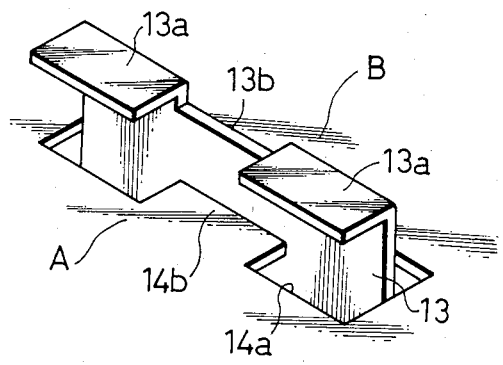
FIG. 5 is an enlarged perspective view of the case showing contact legs and a hole.
Figure 6:
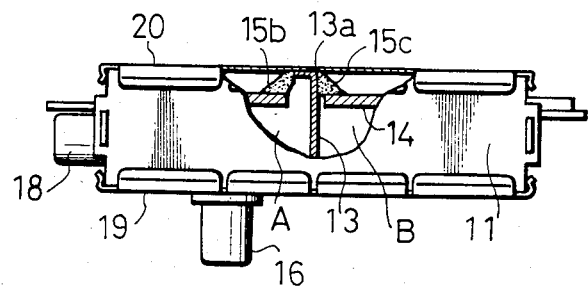
FIG. 6 is a side elevational view, partly cut away, of the assembled case of FIG. 3, with the bottom facing up.

FIG. 3 shows the case for an electronic device which typically comprises an RF modulator having an antenna booster mixer or an RF modulator having an antenna booster switch. The case is shown with a top thereof facing up in perspective in FIG. 3 with upper and lower covers removed. FIG. 4 shows the case in perspective with the covers removed and a case bottom facing up (FIG. 4 corresponds to FIG. 1). FIG. 5 shows the contact legs in perspective at an enlarge scale, and FIG. 6 shows the case in side elevation with the upper and lower covers attached (FIG. 6 corresponds to FIG. 2).

A metal frame 11 extends along four sides of the case for the electronic device. A bent connector attachment plate 12 is mounted on an upper portion of the frame 11 and has an end portion bent at a right angle into a shield plate 13. The shield plate 13 divides the interior of the case into two halves. An antenna circuit is housed in one (side A) of the halves partitioned by the shield plate 13 and a circuit constituting an RF modulator in the other half (side B). A printed-circuit board 14 is housed in the frame 11 and positioned by engagement in positioning projections 11a defined in side plates of the frame 11. The printed-circuit board 14 has edges fixed by solder bodies 15a to inner surfaces of the frame 11.

The printed-circuit board 14 has a pair of holes 14a defined in a central portion thereof. The shield plate 13 has two end portions inserted in the holes 14a, respectively, and having distal ends extending in a bottom opening in the frame 11. The distal ends of the shield plate 13 are bent substantially at a right angle into contact legs 13a. As shown in FIG. 5 at an enlarged scale, each of the contact legs 13a has a central recess 13b which divides the contact leg 13a into two parts. The edge defining each hole 14a in the printed-circuit board 14 has an integral projecting tongue 14b positioned directly below the central recess 13b between the two parts of the contact leg 13a and is slightly smaller than the central recess 13b so that the tongue 14b can pass through the central recess 13b. As shown in FIG. 4, solder bodies 15b are fixed between the antenna circuit (on side A) on the printed-circuit board 14 and the shield plate 13, or more specifically the solder bodies 15b are deposited between the projecting tongue 14b and one side shield plate 13. Therefore, the solder bodies 15b are prevented from being formed as bridges as shown in FIG. 2. A ground pattern 21 on the printed-circuit board 14 extends toward the projection tongue 14b and is soldered to the shield plate 13. Solder bodies 15c are also fixed between the RF modulator circuit (on side B) on the printed-circuit board 14 and the other side of the shield plate 13, the solder bodies 15c being deposited at a position below the recess 13b in the shield plate 13.

An antenna input connector 16 and an antenna output connector 17 are mounted on the connector attachment plate 12, and a connector 18 for connection to a tuner is mounted on one side of the frame 11.

As shown in FIG. 6, a metal cover 19 is mounted in an upper opening (on the lower side as shown) of the frame 11 and another metal cover 20 is mounted in the bottom opening (on the upper side as shown). The contact legs 13a of the shield cover 13 are held in contact with an inner surface of the cover 20 (see FIG. 6).

The case of the above construction for use with an electronic device is assembled as follows: The printed-circuit board 14 is inserted through the bottom opening into the frame 11. At this time, the projecting tongues 14b of the printed-circuit board 14 pass through the recesses 13b.

With the ground pattern on side A of the printed-circuit board 14 extending to the projecting tongues 14b, the latter are connected to the shield plate 13 by the solder bodies 15b. The ground pattern on the printed-circuit board 14 and also the frame 11 are held at the same potential.

The ground pattern on side B of the printed-circuit board is connected by the solder bodies 15c to the shield plate 13. Since the solder bodies 15c are attached below the recesses 13b in the shield plate 13, the solder bodies 15c are prevented from flowing onto the contact legs 13a. Therefore, the upper surfaces of the contact legs 13a are kept smooth and held in reliable contact with the inner surface of the cover 20. The shield plate 13 and the cover 20 are thus held at the same potential.

Although in the illustrated embodiment the recesses 13b are defined centrally in the contact legs 13a, the recesses 13b may be defined in ends of the contact legs 13a. With this alternative, the projecting tongues 14b are formed at the ends of the holes 14a.

The present invention has the following advantages:

(1) Since the recesses are defined in the contact legs at the distal ends of the shield plate and the projecting tongues are formed on the printed-circuit board in alignment with the recesses, the contact legs pass through the holes when the printed-circuit board is inserted into the frame. After the assembling operation, the projecting tongues are disposed close to the shield plate, and thus the projecting tongues and the shield plate can easily be soldered together. Therefore, the soldering can be made with an increased efficiency.

(2) The ground pattern on the printed-circuit board is formed on the projecting tongues and is soldered to the shield plate. Therefore, the pattern can easily be formed on the circuit board.

(3) The recesses are defined in the contact legs at the distal ends of the shield plate and the soldering is effected below the recesses. As a consequence, no solder flows onto the contact legs. The contact surfaces are kept smooth for reliable contact with the cover. The shielding capability is improved to prevent undesired radiation and cover noise.

Although a certain preferred embodiment has been shown and described, it should be understood that many changes and modifications may be made therein without departing from the scope of the appended claims.

What is claimed is:

1. A case housing an electronic device including a printed circuit board, comprising:
    a metal frame having an opening on one side;
    a metal cover covering said opening;
    said circuit board being fixedly mounted in said frame spaced apart from said cover and having at least a hole defined therein;
    a shield plate portion extending through said hole toward an inner surface of said cover and having a distal end thereof provided with a contact leg bent and held in contact against the inner surface of said cover;
    said distal end further defining a recess adjacent said contact leg extending to one side of said shield plate portion, said circuit board including a projecting tongue defining a part of said hole extending proximate said one side of said shield plate portion in alignment with said recess;
    whereby a solder connection can be readily formed between said projecting tongue and said one side of said shield plate portion in alignment with said recess, said recess allowing for solder not to be placed between said contact leg and said inner surface of said cover.

2. A case housing an electronic device according to claim 1, wherein said circuit board has a ground pattern formed on said projecting tongue such that said ground pattern can be soldered to said one side of said shield plate portion.

3. A case housing an electronic device according to claim 2, wherein said ground pattern is soldered to said shield plate on both sides thereof below said recess.

4. A case housing an electronic device according to claim 1 wherein said circuit board is provided with two holes and said case has two corresponding shield plate portions inserted through said holes.

5. A case housing an electronic device according to claim 1 wherein said distal end of said shield plate has two contact legs formed thereon with said recess provided centrally between said contact legs, and said projecting tongue is disposed centrally of said hole.

* * * * *